(12) United States Patent
Han et al.

(10) Patent No.: US 9,520,533 B2
(45) Date of Patent: Dec. 13, 2016

(54) ULTRAVIOLET LIGHT EMITTING DEVICE SEPARATED FROM GROWTH SUBSTRATE AND METHOD OF FABRICATING THE SAME

(71) Applicant: Seoul Viosys Co., Ltd., Ansan-si (KR)

(72) Inventors: Chang Suk Han, Ansan-si (KR); Hwa Mok Kim, Ansan-si (KR); Mi So Ko, Ansan-si (KR); A Ram Cha Lee, Ansan-si (KR); Dae Woong Suh, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/875,578

(22) Filed: Oct. 5, 2015

(65) Prior Publication Data

US 2016/0035935 A1 Feb. 4, 2016

Related U.S. Application Data

(63) Continuation-in-part of application No. PCT/KR2014/002568, filed on Mar. 26, 2014.

(30) Foreign Application Priority Data

Apr. 5, 2013 (KR) ........................ 10-2013-0037255

(51) Int. Cl.
*H01L 33/02* (2010.01)
*H01L 33/06* (2010.01)
(Continued)

(52) U.S. Cl.
CPC ........... *H01L 33/06* (2013.01); *H01L 21/0254* (2013.01); *H01L 21/02458* (2013.01);
(Continued)

(58) Field of Classification Search
CPC ............ H01L 33/0025; H01L 33/0075; H01L 33/0079; H01L 21/02507
See application file for complete search history.

(56) References Cited

U.S. PATENT DOCUMENTS 6,303,405 B1 * 10/2001 Yoshida ............ H01L 21/76251
257/E21.567
2008/0274574 A1 * 11/2008 Yun ..................... H01L 33/0075
438/47

(Continued)

FOREIGN PATENT DOCUMENTS

JP 2007-243090 A 9/2007
JP 2007-266472 A 10/2007
(Continued)

OTHER PUBLICATIONS

Park, H. L., Authorized Officer, Korean Intellectual Property Office, International Application No. PCT/KR2014/002568, International Search Report and Written Opinion, Jun. 24, 2014, 9 pages.

*Primary Examiner* — Michele Fan
(74) *Attorney, Agent, or Firm* — Perkins Coie LLP

(57) ABSTRACT

A UV light emitting device and a method for fabricating the same are disclosed. The method includes forming a first super-lattice layer including $Al_xGa_{(1-x)}N$ on a substrate, forming a sacrificial layer including $Al_zGa_{(1-z)}N$ on the first super-lattice layer, partially removing the sacrificial layer, forming an epitaxial layer on the sacrificial layer, and separating the substrate from the epitaxial layer, wherein the sacrificial layer includes voids, the substrate is separated from the epitaxial layer at the sacrificial layer, and forming an epitaxial layer includes forming an n-type semiconductor layer including n-type $Al_uGa_{(1-u)}N$ ($0<u\leq z\leq x<1$). With this structure, the light emitting device can emit UV light and be separated from the substrate.

17 Claims, 5 Drawing Sheets

(51) Int. Cl.

| | | |
|---|---|---|
| *H01L 21/02* | (2006.01) | |
| *H01L 33/12* | (2010.01) | |
| *H01L 33/32* | (2010.01) | |
| *H01L 33/00* | (2010.01) | |
| *H01L 33/22* | (2010.01) | |
| *H01L 33/24* | (2010.01) | |
| *H01L 33/20* | (2010.01) | |

(52) U.S. Cl.
CPC .. *H01L 21/02507* (2013.01); *H01L 21/02639* (2013.01); *H01L 21/02647* (2013.01); *H01L 33/0025* (2013.01); *H01L 33/0075* (2013.01); *H01L 33/0079* (2013.01); *H01L 33/12* (2013.01); *H01L 33/22* (2013.01); *H01L 33/24* (2013.01); *H01L 33/32* (2013.01); *H01L 33/20* (2013.01)

(56) References Cited

U.S. PATENT DOCUMENTS

| | | | |
|---|---|---|---|
| 2011/0017976 A1* | 1/2011 | Khan | B82Y 20/00 257/13 |
| 2011/0062412 A1* | 3/2011 | Song | H01L 33/14 257/13 |
| 2011/0101304 A1* | 5/2011 | Song | H01L 33/0079 257/13 |
| 2011/0220867 A1* | 9/2011 | Khan | H01L 21/02458 257/13 |
| 2012/0298955 A1 | 11/2012 | Emerson et al. | |
| 2012/0309172 A1* | 12/2012 | Romano | H01L 21/02002 438/478 |
| 2013/0146916 A1* | 6/2013 | Yamamoto | H01L 33/405 257/98 |
| 2013/0214284 A1* | 8/2013 | Holder | H01L 29/2003 257/76 |
| 2014/0023102 A1* | 1/2014 | Holder | H01S 5/1039 372/44.01 |
| 2015/0069583 A1* | 3/2015 | Kadowaki | H01L 33/20 257/627 |

FOREIGN PATENT DOCUMENTS

| | | |
|---|---|---|
| KR | 10-2012-0066257 A | 6/2012 |
| KR | 10-2012-0138014 A | 12/2012 |

* cited by examiner

US 9,520,533 B2

ULTRAVIOLET LIGHT EMITTING DEVICE SEPARATED FROM GROWTH SUBSTRATE AND METHOD OF FABRICATING THE SAME

CROSS-REFERENCE TO RELATED APPLICATION

This patent document is a continuation-in-part application of, and claims priority and benefits of, Patent Cooperation Treaty (PCT) application number PCT/KR2014/002568, entitled "ULTRAVIOLET LIGHT EMITTING DEVICE SEPARATED FROM GROWTH SUBSTRATE AND METHOD OF FABRICATING THE SAME", filed with the Korean Intellectual Property Office (KIPO) on Mar. 26, 2014, which further claims priority and the benefits of Korean Patent Application No. 10-2013-0037255 filed on Apr. 5, 2013. The entire disclosures of the above applications are incorporated by reference as part of this document.

TECHNICAL FIELD

The technology disclosed in this patent document relates to a ultraviolet (UV) light emitting device separated from a growth substrate and a method of fabricating the same. Some implementations of the disclosed technology relate to a UV light emitting device, which emits UV light and is separated from a growth substrate, and a method of fabricating the same.

BACKGROUND

A light emitting device refers to an inorganic semiconductor device which emits light through recombination of electrons and holes, and has been recently applied to various fields such as displays, vehicle lamps, or general lighting, optical communication, and the like. Particularly, application ranges of the UV light emitting device have been broadened to UV curing, sterilization, white light sources, medicine, assistant components, and the like.

A light emitting device generally comprises an n-type semiconductor layer, a p-type semiconductor layer, and an active layer formed therebetween. Since the UV light emitting device emits light having a relatively short peak wavelength (generally, light having a peak wavelength of 400 nm or less), AlGaN containing 20% or more of Al is used when the UV light emitting device is fabricated using a nitride-based semiconductor. When band-gap energy of n-type and p-type nitride semiconductor layers of the UV light emitting device is smaller than energy of UV light, UV light emitted from the active layer can be absorbed into the n-type and p-type nitride semiconductor layers in the light emitting device. In this case, the light emitting device has significantly deteriorated luminous efficacy. Accordingly, not only the active layer of the UV light emitting device, but also other semiconductor layers disposed on a light emitting direction of the light emitting device contain 20% or more of Al.

In fabrication of the UV light emitting device, a sapphire substrate is used as a growth substrate. However, when an $Al_xGa_{(1-x)}N$ (0.2≤x≤1) layer is grown on the sapphire substrate, the $Al_xGa_{(1-x)}N$ (0.2≤x≤1) layer can suffer from cracking or breaking due to thermal or structural deformation resulting from high Al composition. These phenomena result from lattice mismatch and/or difference in coefficient of thermal expansion between the sapphire substrate and the $Al_xGa_{(1-x)}N$ (0.2≤x≤1) layer. In the prior art, to prevent such problems in fabrication of the light emitting device, an AlN layer is grown on the sapphire substrate at high temperature, or an AlN/AlGaN super-lattice layer is formed on the sapphire substrate, followed by forming an N-type semiconductor layer comprising $Al_xGa_{(1-x)}N$ (0.2≤x≤1), an active layer, and a P-type semiconductor layer.

SUMMARY

Some implementations of the disclosed technology provide a method of easily separating a substrate in fabrication of a UV light emitting device. Some implementations of the disclosed technology also provide a UV light emitting device separated from a substrate and having high light intensity.

In one aspect, a method of fabricating a UV light emitting device is provided to comprise: forming a first super-lattice layer comprising $Al_xGa_{(1-x)}N$ on a substrate; forming a sacrificial layer comprising $Al_zGa_{(1-z)}N$ on the first super-lattice layer; partially removing the sacrificial layer; forming an epitaxial layer on the sacrificial layer; and separating the substrate from the epitaxial layer, wherein the sacrificial layer comprises voids, the substrate is separated from the epitaxial layer at the sacrificial layer, and the forming of the epitaxial layer comprises forming an n-type semiconductor layer comprising n-type $Al_uGa_{(1-u)}N$ (0<u≤z≤x<1).

According to this embodiment, it is possible to fabricate a light emitting device that emits light at a peak wavelength within a UV range and is separated from a growth substrate. As a result, the UV light emitting device may have significantly enhanced light intensity.

In some implementations, the forming of the n-type semiconductor layer may comprise forming a first n-type semiconductor layer on the sacrificial layer at a first temperature; forming a second n-type semiconductor layer on the first n-type semiconductor layer at a second temperature; and forming a third n-type semiconductor layer on the second n-type semiconductor layer at a third temperature. Here, the second temperature may be different from the first and third temperatures.

In some implementations, the first temperature may be less than or equal to the third temperature, and the third temperature may be less than the second temperature. In some implementations, the first temperature may range from 1000° C. to 1100° C.; the second temperature may range from 1150° C. to 1200° C.; and the third temperature may range from 1100° C. to 1150° C. and be less than the second temperature.

In some implementations, the method may further comprise, before forming the sacrificial layer, forming a second super-lattice layer comprising $Al_yGa_{(1-y)}N$ (0<u≤z≤y≤x<1) on the first super-lattice layer.

In some implementations, the x may range from 0.75 to 0.85, the z may range from 0.55 to 0.65, and the u may range from 0.45 to 0.55.

In some implementations, the first super-lattice layer may comprise a stack structure of AlN layers and $Al_xGa_{(1-x)}N$ layers alternately stacked one above another.

In some implementations, the substrate may be a sapphire substrate, a GaN substrate, or an AlN substrate.

In some implementations, the method may further comprise, before forming the first super-lattice layer, forming a buffer layer on the substrate. In some implementations, the buffer layer may comprise AlN.

In some implementations, the sacrificial layer may comprise an n-type impurity, and the partially removing of the sacrificial layer may comprise forming a mask pattern on the sacrificial layer, and forming fine voids in the sacrificial layer through electrochemical etching of the sacrificial layer.

In some implementations, during formation of the epitaxial layer, at least some of the fine voids may be combined to form the voids in the sacrificial layer.

In some implementations, the sacrificial layer may have an n-type impurity concentration of $3 \times 10^{18}/cm^3$ to $3 \times 10^{19}/cm^3$.

In some implementations, the separating of the substrate from the epitaxial layer may comprise chemically etching the mask pattern using an etching solution.

In some embodiments, the separating of the substrate from the epitaxial layer may comprise applying stress to the sacrificial layer.

In some implementations, the method may further comprise, before separating the substrate from the epitaxial layer, forming a secondary substrate on the epitaxial layer. In some implementations, the method may further comprise dividing the epitaxial layer and the secondary substrate, from which the substrate is separated, into a plurality of areas.

In another aspect, a template for fabrication of a UV light emitting device is provided to comprise: a substrate; a first super-lattice layer disposed on the substrate and comprising $Al_xGa_{(1-x)}N$; and a sacrificial layer disposed on the first super-lattice layer and comprising $Al_zGa_{(1-z)}N$ ($0<z \le x<1$).

In some implementations, the template may further comprise a second super-lattice layer disposed between the first super-lattice layer and the sacrificial layer and comprising $Al_yGa_{(1-y)}N$ ($0<z \le y \le x<1$).

In some implementations, the template may further comprise an AlN buffer layer disposed between the substrate and the first super-lattice layer.

In another aspect, a UV light emitting device is provided to comprise a p-type semiconductor layer comprising p-type AlGaN; an active layer disposed on the p-type semiconductor layer and comprising AlGaN; and an n-type semiconductor layer disposed on the active layer and comprising n-type $Al_uGa_{(1-u)}N$, wherein light emitted from the active layer is configured to emit outside through a surface of the n-type semiconductor layer.

In some implementations, u may range from 0.45 to 0.55.

In some implementations, the light emitting device may have roughness formed on the surface of the n-type semiconductor layer through which light is emitted.

In some implementations, the light emitting device may further comprise a secondary substrate disposed under the p-type semiconductor layer.

In some implementations, the light emitting device may further comprise an n-type electrode and a p-type electrode, wherein the secondary substrate has a greater width than the p-type semiconductor layer, an upper surface of the secondary substrate is partially exposed, the n-type electrode is disposed on the n-type semiconductor layer, and the p-type electrode is disposed on an exposed portion of the upper surface of the secondary substrate.

In some implementations, The light may have a peak wavelength ranging from 200 nm to 400 nm.

Embodiments of the disclosed technology provides a template for fabrication of a UV light emitting device, a method of fabricating the same, and a method of fabricating a UV light emitting device separated from a substrate using the template. According to the embodiments of the invention, in fabrication of the UV light emitting device, the substrate can be easily separated from the epitaxial layer. In addition, the method and template according to the embodiments of the disclosed technology can minimize stress applied to semiconductor layers upon separation of the substrate while ensuring excellent crystal quality of the semiconductor layers.

In addition, embodiments of the disclosed technology provide a UV light emitting device having high UV intensity using the method.

DETAILED DESCRIPTION

Figure 1:
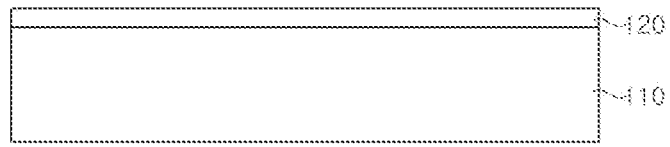
FIGS. 1 to 4 are sectional views illustrating a template for fabrication of a UV light emitting device and a method of fabricating the template in accordance with one embodiment of the disclosed technology.

The sapphire substrate is generally separated from the semiconductor layers by laser lift-off. In the UV light emitting device, when the sapphire substrate is separated by laser lift-off, it is desirable that the AlN layer or the AlN/AlGaN super-lattice layer disposed between the semiconductor layers and the sapphire substrate absorb most laser beams instead of allowing transmission therethrough. When the AlN layer or the AlN/AlGaN super-lattice layer allows transmission of laser beams therethrough, the sapphire substrate cannot be efficiently separated from the semiconductor layers and the semiconductor layers above the AlN layer or the AlN/AlGaN super-lattice layer can absorb laser beams. When absorbing the laser beams, the semiconductor layers can be decomposed by heat, thereby causing failure of the light emitting device.

In laser lift-off, an excimer laser beam having a longer or substantially similar wavelength to band-gap energy of AlN is generally used. For example, a KrF excimer laser beam has a wavelength of 248 nm, which can pass through the AlN layer, and thus is difficult to use. An ArF excimer laser beam has a wavelength of 193 nm which can be absorbed by the AlN layer. However, since the ArE excimer laser beam has an insignificant difference from a wavelength corresponding to the band-gap energy of the AlN layer, i.e., about 200 nm, some of the laser beam pass through the AlN layer or the AlN/AlGaN super-lattice layer. In addition, the ArF excimer laser has low pulse energy and does not provide sufficient energy for the separation of the substrate.

For such reasons, conventional UV light emitting devices have been fabricated in the form of horizontal type or flip chip type. The horizontal type or flip chip type UV light emitting devices have problems of low optical efficiency and light intensity due to the structural limits. As a result, conventional UV light emitting devices do not provide sufficient light intensity that are required according to various purposes.

Hereinafter, embodiments of the disclosed technology will be described in more detail with reference to the accompanying drawings. It should be understood that the following embodiments are given by way of illustration only to facilitate the understanding of some implementations of the disclosed technology. Therefore, the disclosed technology is not limited to the following embodiments and may be embodied in different ways. In addition, the widths, lengths, and thicknesses of certain components, layers or features may be exaggerated for clarity.

It will be understood that when an element or layer is referred to as being "on" or "connected to" another element or layer, it can be directly on or directly connected to the other element or layer, or intervening elements or layers may be present. It will be understood that for the purposes of this disclosure, "at least one of X, Y, or Z" can be construed as X only, Y only, Z only, or any combination of two or more items X, Y, or Z (e.g., XYZ, XYY, YZ, ZZ). Like components will be denoted by like reference numerals throughout the specification.

FIGS. 1 to 14 are sectional views illustrating a method of fabricating a UV light emitting device separated from a substrate in accordance with one embodiment of the disclosed technology. Hereinafter, it will be noted that the following nitride semiconductor layers may be fabricated by various methods, for example, metal organic chemical vapor deposition (MOCVD), molecular beam epitaxy (MBE), or hydride vapor phase epitaxy (HVPE), and the like.

FIGS. 1 to 4 are sectional views illustrating a template for fabricating a UV light emitting device and a method of fabricating the UV light emitting device in accordance with one embodiment of the disclosed technology.

Referring to FIG. 1, a buffer layer 120 may be formed on a substrate 110.

As for the substrate 110, any substrate capable of growing a nitride semiconductor layer thereon may be used without limitation. For example, the substrate 110 may be or include a sapphire substrate, a silicon carbide substrate, a spinel substrate, a GaN substrate, or an AlN substrate, and the like. As one example, the substrate 110 may be or include a sapphire substrate or an AlN substrate.

The buffer layer 120 may be grown to a thickness of about 500 nm on the substrate 110. The buffer layer 120 may be or include a nitride layer comprising (Al, Ga, In)N. In some implementations, the buffer layer 120 may comprise AlN. The buffer layer 120 may act as a nucleus layer for growing nitride layers in subsequent processes. The buffer layer 120 may serve to relieve lattice mismatch between the substrate 110 and the nitride layers grown on the buffer layer 120 and relieve generation of defects such as dislocations.

When the substrate is or includes a nitride substrate such as a GaN substrate or an AlN substrate, the buffer layer 120 may be omitted.

Figure 2:
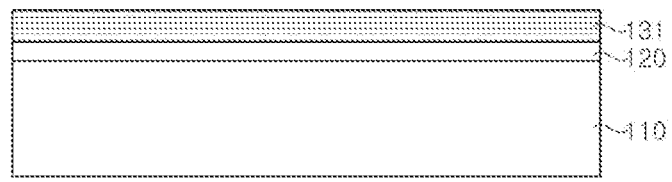

Referring to FIG. 2, a first super-lattice layer 131 is formed on the buffer layer 120.

The first super-lattice layer 131 may be formed to a thickness of, for example, about 1200 nm to about 1300 nm by alternately stacking two or more types of material layers. The first super-lattice layer 131 may comprise $Al_xGa_{(1-x)}N$ (0<x<1), and may further comprise AlN. In addition, the first super-lattice layer 131 may have a stack structure of AlN layers and $Al_xGa_{(1-x)}N$ layers (0<x<1) alternately stacked one above another.

Figure 3:

Referring to FIG. 3, a second super-lattice layer 133 may be further formed on the first super-lattice layer 131. The second super-lattice layer 133 may be formed to a thickness of, for example, about 1200 nm to about 1300 nm and may be thinner than the first super-lattice layer 131, but is not limited thereto. The second super-lattice layer 133 may comprise AlyGa(1−y)N (0<y<1), and may further comprise AlN. Further, the second super-lattice layer 133 may have a stack structure of AlN layers and AlyGa(1−y)N layers (0<y<1) alternately stacked one above another.

The first and second super-lattice layers 131 and 133 may relieve lattice mismatch between the substrate 110 and the semiconductor layers grown by subsequent processes, and may relieve stress caused by lattice mismatch. Accordingly, the light emitting device according to the disclosed technology may prevent occurrence of cracking in an n-type semiconductor layer 161, an active layer 163, a p-type semiconductor layer 165, and the like.

Figure 4:
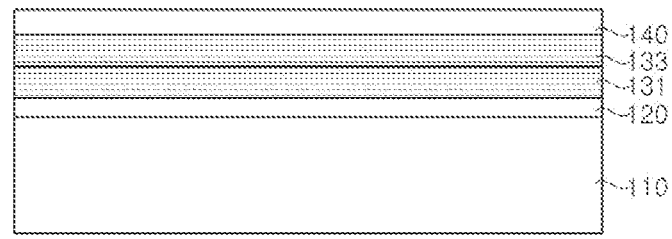

Next, referring to FIG. 4, a sacrificial layer 140 is formed on the second super-lattice layer 133.

The sacrificial layer 140 may comprise AlzGa(1−z)N (0<z<1) and may be or include an n-type AlzGa(1−z)N layer (0<z<1) containing n-type impurities. The n-type impurity may be Si impurities, and may be doped in a concentration of, for example, 3×1018/cm3 to 3×1019/cm3. In particular, when the sacrificial layer 140 comprises n-type AlzGa(1−z)N (0<z<1), fine voids 141 and voids 145 may be formed in the sacrificial layer 140 by electrochemical etching (ECE) in a subsequent process.

The first super-lattice layer 131, the second super-lattice layer 133 and the sacrificial layer 140 may comprise AlxGa(1−x)N, AlyGa(1−y)N and AlzGa(1−z)N, respectively, (0<z≤y≤x<0). For example, x may range from 0.75 to 0.85, y may range from 0.65 to 0.75, and z may range from 0.55 to 0.65. In other words, the Al composition ratio may decrease with increasing distance from the substrate 110.

As such, the Al composition ratio in AlGaN of the first super-lattice layer 131, the second super-lattice layer 133 and the sacrificial layer 140 is adjusted to be gradually decreased, thereby minimizing lattice mismatch and stress caused thereby. For example, when the buffer layer 120 is formed of or includes AlN (Al composition ratio=1.0), the first super-lattice layer 131, the second super-lattice layer 133, and the sacrificial layer 140 have the Al composition ratios of 0.80, 0.70, and 0.60, respectively. Thus, the Al composition ratio is gradually decreased from the first super-lattice layer 131 to the second super-lattice layer 133 and the sacrificial layer 140. With this structure, frequency of lattice mismatch in the sacrificial layer 140 can be reduced, thereby relieving stress caused by lattice mismatch. As a result, epitaxial layers 160 formed on the sacrificial layer 140 have improved crystal quality, thereby improving luminous efficacy of the light emitting device.

It should be understood that the Al composition ratio of AlGaN in each of the first super-lattice layer 131, the second super-lattice layer 133 and the sacrificial layer 140 is not limited thereto, and may vary depending upon the kind of substrate 110 and the Al composition ratio of the epitaxial layers 160.

In addition, the light emitting device may further comprise a stress relieving layer (not shown) between the first super-lattice layer 131 and the second super-lattice layer 133 and/or between the second super-lattice layer 133 and the sacrificial layer 140.

The stress relieving layer may comprise AlGaN, and may be disposed between the first super-lattice layer 131 and the second super-lattice layer 133 and/or between the second super-lattice layer 133 and the sacrificial layer 140 to relieve stress caused by lattice mismatch. Thus, the stress relieving layer may have an Al composition ratio between those of the semiconductor layers disposed on and under the stress relieving layer. For example, when the stress relieving layer is further formed between the first super-lattice layer 131 (Al composition ratio=0.80) and the second super-lattice layer 133 (Al composition ratio=0.70), the stress relieving layer may have an Al composition ratio of 0.70 to 0.80.

The stress relieving layer may be formed as a single layer, or may comprise multiple layers, each having the Al composition ratio sequentially changed. In some implementations, the stress relieving layer may comprise a grading layer having the Al composition ratio successively changed. For example, when the stress relieving layer comprises multiple layers, each having the Al composition ratio sequentially changed, four layers may be formed between the first super-lattice layer 131 (Al composition ratio=0.80) and the second super-lattice layer 133 (Al composition ratio=0.70) such that the four layers have Al composition ratios of 0.72, 0.74, 0.76 and 0.78, respectively. Alternatively, when the stress relieving layer comprises a grading layer having the Al composition ratio successively changed, a single layer may be formed between the first super-lattice layer 131 (Al composition ratio=0.80) and the second super-lattice layer 133 (Al composition ratio=0.70) such that the single layer has the Al composition ratio that is successively changed from 0.70 to 0.80. It should be understood that these composition ratios of the stress relieving layer are provided for illustration only, and the Al composition ratios of the first super-lattice layer 131, the second super-lattice layer 133 and the sacrificial layer 140 may be adjusted in various ways.

As a result, the template for fabrication of a UV light emitting device, which comprises the substrate 110, the first super-lattice layer 131 and the sacrificial layer 133, is provided. The template for fabrication of the UV light emitting device may further comprise the buffer layer 120 and the second super-lattice layer 133. Each component is the same as the component described above, and a detailed description thereof will be omitted.

Next, FIGS. 5 to 14 are sectional views illustrating a UV light emitting device and a method for fabricating the same in accordance with one embodiment of the disclosed technology. The method may employ the template for fabrication of the UV light emitting device described with reference to FIGS. 1 to 4.

Figure 5:
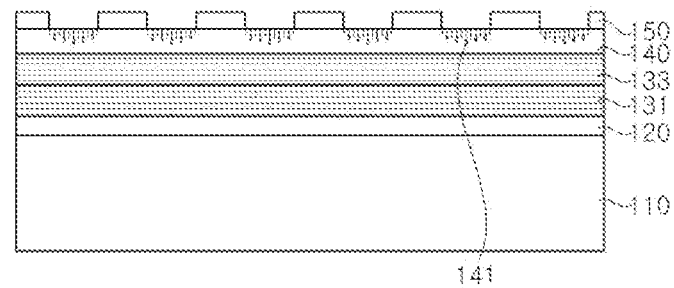
FIGS. 5 to 14 are sectional views illustrating a UV light emitting device and a method of fabricating the UV light emitting device in accordance with one embodiment of the disclosed technology.

Referring to FIG. 5, a mask pattern 150 is formed on the sacrificial layer 140, which in turn is partially removed to form fine voids 141.

The mask pattern 150 formed on the sacrificial layer 140 comprises an opening region and a masking region as shown in FIG. 5. An upper surface of the sacrificial layer 140 is partially exposed through the opening region. The mask pattern 150 may comprise SiO2. The mask pattern 150 may be formed by depositing SiO2 on the overall surface of the sacrificial layer 140 by E-beam evaporation or the like, followed by patterning to form the opening region. Alternatively, the mask pattern 150 may be formed by other various methods, for example, laser lift-off, without being limited thereto.

After the mask pattern 150 comprising the opening region is formed, the sacrificial layer 140 may be partially removed by electrochemical etching (ECE). By electrochemical etching, fine voids 141 may be formed on the sacrificial layer 140. In some implementations, the fine voids 141 are mainly formed under the opening region, as shown in FIG. 5.

Electrochemical etching may be performed by dipping the sacrificial layer 140 into an etching solution such as an oxalic acid solution, followed by applying a predetermined voltage to the sacrificial layer 140. For example, electrochemical etching may be performed by successively applying a voltage in the range of 10V to 60V, or may be performed by applying different voltages in two or more stages. The size of the fine voids 141 may be adjusted by adjusting various factors including the composition and concentration of the etching solution, voltage application time, applied voltage, or the number of stages for voltage application during the electrochemical etching. As a result, it is possible to form the fine voids 141 having various sizes.

Figure 6:
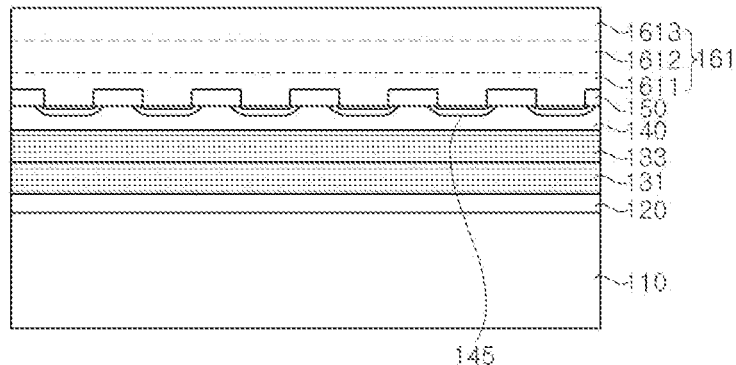

Next, referring to FIG. 6, an n-type semiconductor layer 161 is formed on the sacrificial layer 140 to cover the mask pattern 150.

The n-type semiconductor layer 161 may be formed to a thickness of, for example, about 3000 nm or more by MOCVD and the like, and may be formed through epitaxial lateral overgrowth (ELO) using the sacrificial layer 140 under the opening region of the mask pattern 150 as a seed layer. Accordingly, the n-type semiconductor layer 161 may cover the mask pattern 150. The n-type semiconductor layer 161 may comprise AluGa(1−u)N (0<u<1), and may comprise n-type impurities such as Si. In AluGa(1−u)N (0<u<1), u may be less than or equal to x, y and z (0<u≤z≤y≤x<1). For example, u may range from 0.45 to 0.55. As a result, each of the layers can be formed such that the Al composition ratios of the first super-lattice layer 131, the second super-lattice layer 133, the sacrificial layer 140 and the n-type semiconductor layer 161 can be sequentially lowered, thereby minimizing stress caused by lattice mismatch of the n-type semiconductor layer 161. Here, it should be understood that the u value is not limited to the aforementioned range and may be freely selected within the range of less than the z value according to peak wavelengths of the light emitting device.

The n-type semiconductor layer 161 may comprise a plurality of layers grown under various temperature conditions. As shown in FIG. 6, the n-type semiconductor layer 161 may comprise a first n-type semiconductor layer 1611 grown at a first temperature, a second n-type semiconductor layer 1612 grown at a second temperature, and a third n-type semiconductor layer 1613 grown at a third temperature. The first temperature may be less than or equal to the third temperature, and the third temperature may be less than second temperature. In addition, the second temperature may be different from the first and third temperatures.

For example, the first n-type semiconductor layer 1611 may be grown at a temperature of 1000° C. to 1100° C. and a pressure of 50 torr to 200 torr, the second n-type semiconductor layer 1612 may be grown at a temperature of 1150° C. to 1200° C. and a pressure of 50 torr to 200 torr, and the third n-type semiconductor layer 1613 may be grown at a temperature of 1100° C. to 1150° C. and a pressure of 50 torr to 200 torr. Since the first n-type semiconductor layer 1611 is grown at a relatively low temperature, the semiconductor layer can be grown without cracking and the like, whereas the first n-type semiconductor layer 1611 can have lower crystal quality than the second and third n-type semiconductor layers 1612 and 1613 due to low growth temperature. However, it is possible to improve crystal quality by growing the second n-type semiconductor layer 1612, which is grown at the highest temperature, on the first n-type semiconductor layer 1611. As a result, the third n-type semiconductor layer 1613 grown on the second n-type semiconductor layer 1612 can have excellent crystal quality. As such, an active layer 163 formed on the third n-type semiconductor layer 1613 can have excellent crystal quality, whereby the light emitting device can have improved luminous efficacy.

The first to third n-type semiconductor layers 1611, 1612 and 1613 may comprise AluGa(1−u)N (0<u<1), in which each of the semiconductor layers may have the same Al composition ratio. Here, it should be understood that the disclosed technology is not limited thereto and the Al composition ratio of each of the semiconductor layers may be set in various ways.

On the other hand, while the n-type semiconductor layer 161 is grown on the sacrificial layer 140, the fine voids 141 in the sacrificial layer 140 may be combined with each other and/or grown to form the voids 145. Accordingly, together with growth of the n-type semiconductor layer 161, the sacrificial layer 140 may comprise the voids 145. In some implementations, the voids 145 may be mainly formed under the opening region of the mask pattern 150. In some implementations, the voids 145 may also be partially formed under the masking region.

Figure 7:
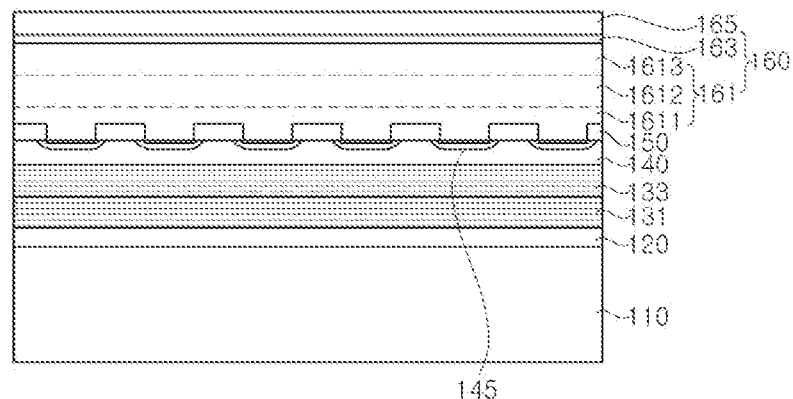

Next, referring to FIG. 7, the active layer 163 and a p-type semiconductor layer 165 are grown on the n-type semiconductor layer 161, thereby forming the epitaxial layers 160. For example, the epitaxial layer 160 may comprises the n-type semiconductor layer 161, the active layer 163 and a p-type semiconductor layer 165.

The active layer 163 may be formed to have barrier layers (not shown) and well layers (not shown), which are alternately stacked one above another. The barrier layers may comprise an AlvGa(1−v)N layer (0.30≤v≤0.50) and the well layers may comprise an AlwGa(1−w)N layer (0.20≤w≤0.40). Here, in order to achieve effective confinement of electrons in the well layers, w is less than v (w<v). Within this range of w, the light emitting device fabricated by the method according to this embodiment can emit light at a UV peak wavelength.

In addition, among the barrier layer, a barrier layer most adjacent to the n-type semiconductor layer 161 may have a higher Al composition than other barrier layers. With the structure in which the barrier layer most adjacent to the n-type semiconductor layer 161 has a wider band gap than other barrier layers, it is possible to reduce a speed of the electrons and effectively achieve the prevention of an electron overflow.

The p-type semiconductor layer 165 may be formed to a thickness of, for example, about 300 nm by various techniques including MOCVD and the like. The p-type semiconductor layer 165 may comprise AlGaN. The Al composition ratio of the p-type semiconductor layer 165 may be determined according to a peak wavelength of light emitted from the active layer 163. In other words, in order to prevent UV light emitted from the active layer 163 from being absorbed into the p-type semiconductor layer 165, the Al composition of the p-type semiconductor layer 165 may be determined to have band gap energy greater than or equal to the peak wavelength of the UV light.

Furthermore, the p-type semiconductor layer 165 may further comprise a delta doping layer (not shown) in order to reduce ohmic contact resistance.

Figure 8:
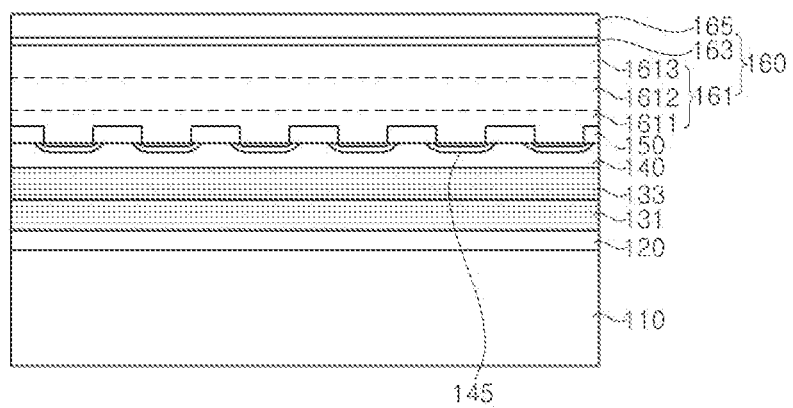

Referring to FIG. 8, a metal layer 170 is formed on the epitaxial layers 160.

The metal layer 170 may comprise a reflective metal layer (not shown) and a barrier metal layer (not shown). The barrier metal layer may be formed to cover the reflective metal layer.

In some implementations, the reflective metal layer may be formed through deposition and lift-off. The reflective metal layer may serve to reflect light and act as an electrode electrically connected to the epitaxial layers 160. Accordingly, the reflective metal layer preferably comprises a material which can form ohmic contact while exhibiting high reflectance relative to UV light. The reflective metal layer may comprise at least one of, for example, Ni, Pt, Pd, Rh, W, Ti, Al, Ag or Au.

The barrier metal layer prevents inter-diffusion of different materials than those of the reflective metal layer. As a result, it is possible to prevent increase in contact resistance and deterioration in reflectance due to damage of the reflective metal layer. The barrier metal layer may comprise at least one of Ni, Cr, or Ti. Further, the barrier metal layer may be formed as multiple layers.

Figure 9:
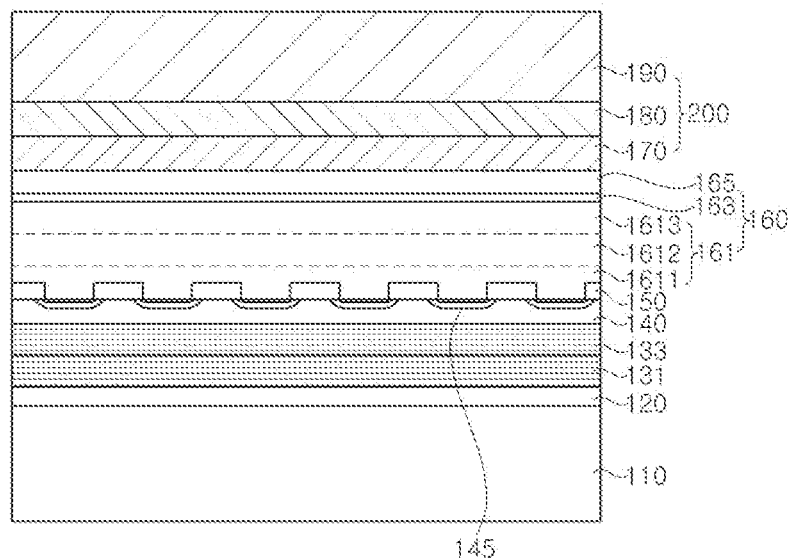

Next, referring to FIG. 9, a support substrate 190 may be formed on the metal layer 170, and a bonding layer 180 may be formed to bond the support substrate 190 and the metal layer 170. As a result, a secondary substrate 200 comprising the metal layer 170, the bonding layer 180 and the support substrate 190 may be formed.

The support substrate 190 may be or include an insulating substrate, a conductive substrate, or a circuit substrate. For example, the support substrate 170 may be or include a sapphire substrate, a gallium nitride substrate, a glass substrate, a silicon carbide substrate, a silicon substrate, a metal substrate, or a ceramic substrate, or the like.

The bonding layer 180 may comprise a metallic material, for example, AuSn. The bonding layer comprising AuSn permits eutectic bonding between the support substrate 190 and the metal layer 170. When the support substrate 190 is a conductive substrate, the bonding layer electrically connects the metal layer 170 to the support substrate 190.

Figure 10:
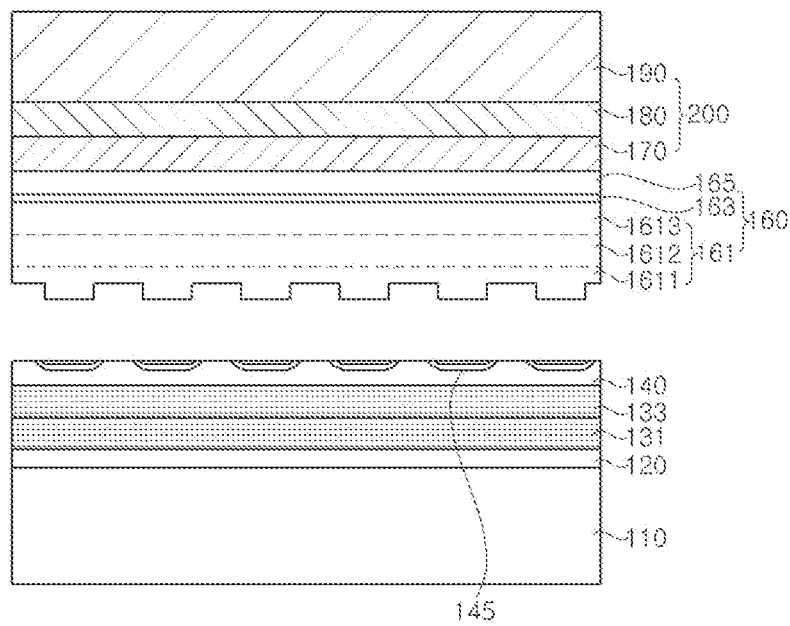

Then, as shown in FIG. 10, the substrate 110 may be separated from the epitaxial layers 160 at the sacrificial layer 140.

Separation of the substrate 110 from the epitaxial layers 160 may be performed by, for example, chemical lift-off or stress lift-off. In this embodiment, the substrate 110 is separated from the epitaxial layers 160 by chemical lift-off. However, it should be understood that the disclosed technology is not limited thereto and may also comprise application of stress to the sacrificial layer 140 to separate the substrate 110.

Hereinafter, a separation method of the substrate 110 will be described in more detail.

First, the mask pattern 150 is removed using an etching solution. The etching solution spreads over the substrate 110 through the voids 145 used as a flow channel, and chemically etches the mask pattern near the voids 145. The etching solution may comprise at least one of a buffered oxide etchant (BOE), or HF, and the like. As the mask pattern 150 is etched, the substrate 110 can be naturally separated through weakening of bonding between the n-type semiconductor layer 161 and the sacrificial layer 140. In addition, to facilitate separation of the substrate 110, predetermined stress may be applied to the sacrificial layer 140 after etching the mask pattern 150.

According to this embodiment, electrochemical etching is used as a process for forming the voids 145 in the sacrificial layer 140. However, it should be understood that the disclosed technology is not limited thereto and various methods may be used to form the voids 145 in the sacrificial layer 140. For example, the sacrificial layer 140 may be partially etched to form protrusions and depressions, and the n-type semiconductor layer 161 may be grown on the protrusions through epitaxial lateral overgrowth (ELO) to form the voids.

Figure 11:
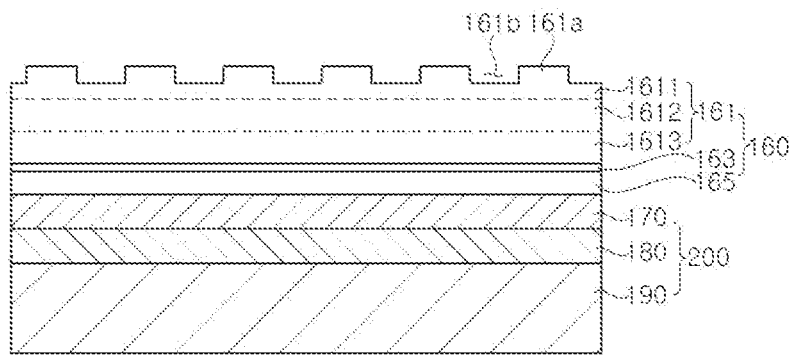

FIG. 11 shows the secondary substrate 200 and the semiconductor layers after separation of the substrate 110, in which the components are shown in an upside down state as compared with those shown in FIG. 10.

When the substrate 110 is separated, protrusions 161a and depressions 161b are formed on the n-type semiconductor layer 161.

After separation of the substrate 110, the sacrificial layer 120 remaining on the n-type semiconductor layer 161 may be removed by dry etching and the like. In addition, since the surface of the n-type semiconductor layer 161 can be partially damaged in the course of separating the substrate 110, the damaged portion may be removed therefrom by wet etching or dry etching after separation of the substrate 110. When the surface of the n-type semiconductor layer 161 is etched, the protrusions 161a and the depressions 161b may have a gentler slope.

Figure 12:
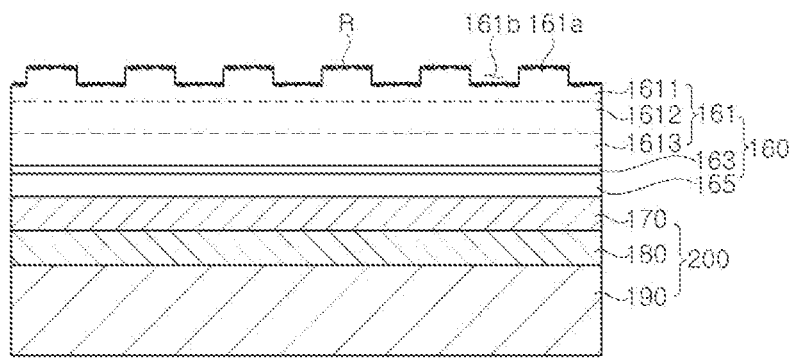

Referring to FIG. 12, roughness R may be formed on the surface of the n-type semiconductor layer 161 by increasing surface roughness of the n-type semiconductor layer. The roughness R may be formed by wet etching, for example, photo-enhanced chemical (PEC) etching using sulfuric-phosphoric acid solution, and the like. The roughness R may be determined in various ways depending upon etching conditions, and may have an average height of, for example, 0.5 μm or less. By forming the roughness R, the UV light emitting device may have improved light extraction efficiency.

Figure 13:
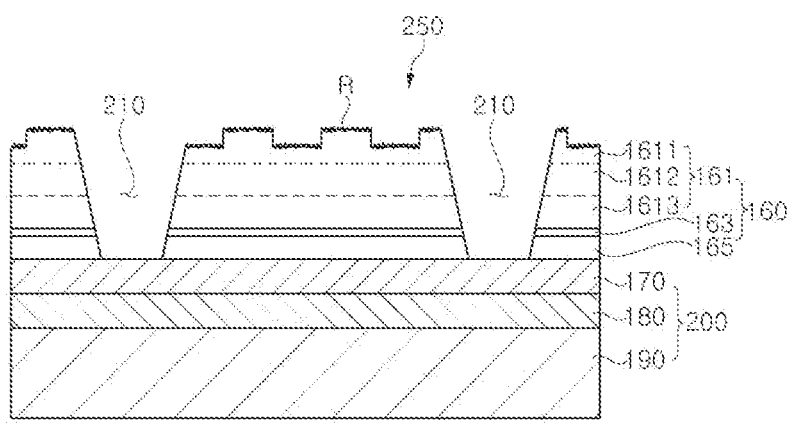

Referring to FIG. 13, the epitaxial layers 160 are subjected to patterning to form a device isolation area 210. Here, the patterning may be conducted by, for example, dry etching. As the device isolation area 210 is formed, the upper surface of the secondary substrate 200 can be partially exposed, and the epitaxial layers 160 may be divided into at least one device area 250.

On the other hand, although not shown, a passivation layer (not shown) may be further formed to cover upper and side surfaces of the device area 250. The passivation layer can protect the light emitting device from external environments and is formed on the roughness R on the surface of the n-type semiconductor layer 161 to provide a gentler slope, thereby improving light extraction efficiency.

Figure 14:
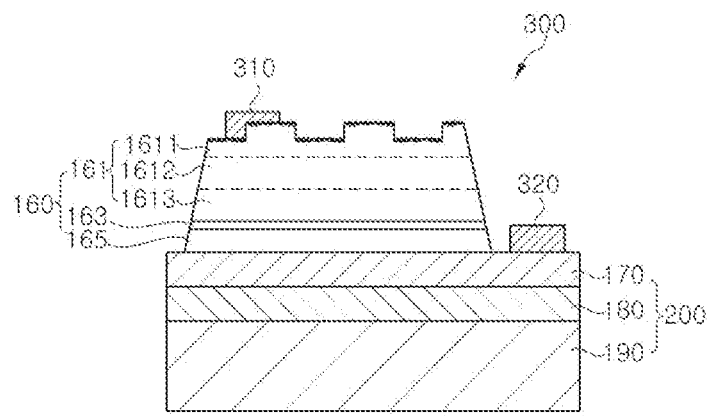

Next, an n-type electrode 310 and a p-type electrode 320 are formed, and an area under the device isolation area 210 in the secondary substrate 200 is divided, thereby providing a vertical type UV light emitting device 300, which is separated from the growth substrate, as shown in FIG. 14. The light emitting device 300 may emit light having a peak wavelength of 200 nm to 400 nm, and may also emit light having a peak wavelength of 200 nm to 340 nm.

The secondary substrate 200 may be divided such that the width of the secondary substrate of each light emitting device 300 becomes greater than the width of the device area 250. With this structure, it is possible to form the p-type electrode 320 on an exposed region of the secondary substrate 200 while dividing the secondary substrate 200.

According to the method of fabricating the UV light emitting device separated from the substrate, the light emitting device is fabricated by forming the first and second super-lattice layers 131 and 133, the sacrificial layer 140, and the first to third n-type semiconductor layers 161, and is easily separated from the substrate 110 by chemical lift-off or stress lift-off. Accordingly, the fabrication method according to the disclosed technology can resolve difficulty in fabrication of the UV light emitting device separated from the substrate, which were found in the relevant art.

As such, in the UV light emitting device 300 according to the disclosed technology, the substrate 110 is removed from the UV light emitting device, whereby light emitted from the active layer 163 is directly emitted through the surface of the n-type semiconductor layer 161, thereby significantly improving light intensity.

Figure 15:
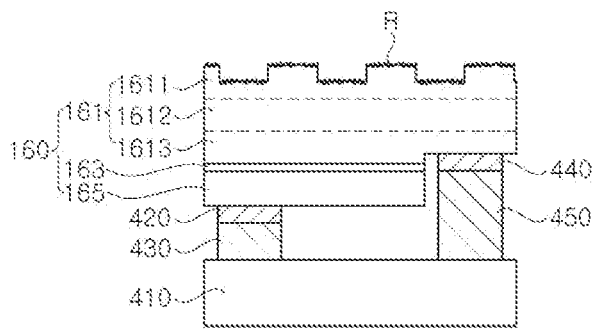
FIG. 15 is a sectional view of an exemplary flip chip type UV light emitting device separated from a substrate in accordance with another embodiment of the disclosed technology.

FIG. 15 is a sectional view of a flip chip type UV light emitting device separated from a substrate, in accordance with another embodiment of the disclosed technology.

Referring to FIG. 15, the light emitting device may comprise epitaxial layers 160, a secondary substrate 410, an n-type electrode 440, and a p-type electrode 420. In addition, the light emitting device may further comprise an n-type bump 450 and a p-type bump 430. Furthermore, the epitaxial layers 160 may comprise an n-type semiconductor layer 161, an active layer 163, and a p-type semiconductor layer 165. For example, the light emitting device according to this embodiment is a flip chip type and is separated from the growth substrate.

In this embodiment, the epitaxial layers 160 are generally similar to the epitaxial layers described with reference to FIG. 5 to FIG. 14, and a detailed description thereof will be omitted.

However, according to this embodiment, the epitaxial layers 160 are subjected to mesa etching such that a lower surface of the n-type semiconductor layer 161 is partially exposed, and the n-type electrode 440 may be formed on the exposed portion of the lower surface of the n-type semiconductor layer 161. The p-type electrode 420 may be formed on the p-type semiconductor layer 165, and the bumps 430 and 450 may be formed on the electrodes 420 and 440, respectively. The light emitting device may be electrically connected to the secondary substrate 410 by the electrodes 420 and 450 and the bumps 430 and 450. Here, the secondary substrate 410 may be or include a PCB, but is not limited thereto. As the secondary substrate, any substrate capable of electrically connecting the light emitting device may be used without limitation. For example, an insulating substrate comprising a lead frame may be used as the secondary substrate.

In addition, the light emitting device according to this embodiment may further comprise a reflective layer (not shown) on the lower surface of the p-type semiconductor layer 165, thereby improving intensity of light emitted through the upper surface of the light emitting device.

Descriptions of well-known techniques relating to flip-chips are omitted.

Figure 16:
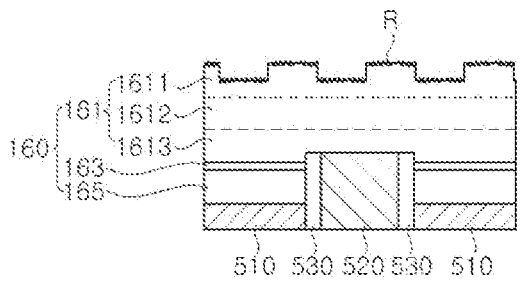
FIG. 16 is a sectional view of an exemplary via-hole type UV light emitting device separated from a substrate in accordance with a further embodiment of the disclosed technology.

FIG. 16 is a sectional view of a via-hole type UV light emitting device separated from a substrate, in accordance with a further embodiment of the disclosed technology.

The light emitting device of FIG. 16 is generally similar to the light emitting device of FIG. 15, and a difference between the light emitting devices in FIGS. 15 and 16 will be mainly described below.

Referring to FIG. 16, epitaxial layers 160 are partially removed to expose a portion of a lower surface of an n-type semiconductor layer 161. For example, at the middles of the epitaxial layers 160, a portion of a p-type semiconductor layer 165, a portion of an active layer 163, and a portion of the n-type semiconductor layer 161 are removed to form a hole.

A p-type electrode 510 may be formed on a lower surface of the p-type semiconductor layer 165, and an n-type electrode 520 may be formed on an exposed portion of a lower surface of the n-type semiconductor layer 161. Here, the n-type electrode 520 may be formed to have at least a greater height than the depth of the hole and thus further protrude than the lower surface of the p-type semiconductor layer 165. The p-type electrode 510 and the n-type electrode 520 may comprise a reflective layer (not shown), thereby improving intensity of light emitted through the upper surface of the light emitting device.

In addition, the light emitting device may further comprise an insulating layer 530 surrounding the n-type electrode 520, whereby the n-type electrode 520 and the p-type electrode 510 can be electrically isolated from each other.

Although some embodiments have been described above, it should be understood that the disclosed technology is not limited to these embodiments and features, and that various modifications, changes, and alterations can be made without departing from the spirit and scope of the disclosed technology.

The invention claimed is:

1. A method of fabricating a UV light emitting device, comprising:
   forming a first super-lattice layer comprising $Al_xGa_{(1-x)}N$ on a substrate;
   forming a sacrificial layer comprising $Al_zGa_{(1-z)}N$ on the first super-lattice layer;
   partially removing the sacrificial layer;
   forming an epitaxial layer on the sacrificial layer; and
   separating the substrate from the epitaxial layer,
   wherein the sacrificial layer comprises voids, the substrate is separated from the epitaxial layer at the sacrificial layer, and
   wherein the forming of the epitaxial layer comprises forming an n-type semiconductor layer comprising n-type $Al_uGa_{(1-u)}N$ ($0<u\leq z\leq x<1$).

2. The method of claim 1, wherein the forming of the n-type semiconductor layer comprises:
   forming a first n-type semiconductor layer on the sacrificial layer at a first temperature;
   forming a second n-type semiconductor layer on the first n-type semiconductor layer at a second temperature; and
   forming a third n-type semiconductor layer on the second n-type semiconductor layer at a third temperature,
   wherein the second temperature is different from the first temperature and the third temperature.

3. The method of claim 2, wherein the first temperature is less than or equal to the third temperature, and the third temperature is less than the second temperature.

4. The method of claim 1, further comprising:
   forming a second super-lattice layer comprising $Al_yGa_{(1-y)}N$ ($0<u\leq z\leq y\leq x<1$) on the first super-lattice layer, before forming the sacrificial layer,
   wherein the x ranges from 0.75 to 0.85, the z ranges from 0.55 to 0.65, and the u ranges from 0.45 to 0.55.

5. The method of claim 1, wherein the first super-lattice layer comprises a stack structure including AlN layers and $Al_xGa_{(1-x)}N$ layers alternately stacked one above another.

6. The method of claim 1, further comprising:
   forming a buffer layer on the substrate, before forming the first super-lattice layer.

7. The method of claim 6, wherein the buffer layer comprises AlN.

8. The method of claim 1, wherein the sacrificial layer comprises an n-type impurity, and
   wherein the partially removing of the sacrificial layer comprises:
   forming a mask pattern on the sacrificial layer; and
   forming fine voids in the sacrificial layer through electrochemical etching of the sacrificial layer.

9. The method of claim 8, wherein at least some of the fine voids are combined to form the voids in the sacrificial layer during the formation of the epitaxial layer.

10. The method of claim 8, wherein the separating of the substrate from the epitaxial layer comprises chemically etching the mask pattern using an etching solution.

11. The method of claim 8, wherein the separating of the substrate from the epitaxial layer comprises applying stress to the sacrificial layer.

12. The method of claim 1, wherein the separating of the substrate from the epitaxial layer comprises applying stress to the sacrificial layer.

13. The method of claim 1, further comprising:
   forming a secondary substrate on the epitaxial layer, before separating the substrate from the epitaxial layer.

14. The method of claim 13, further comprising:
   dividing the epitaxial layer and the secondary substrate, from which the substrate is separated, into a plurality of areas.

15. A template for fabrication of a UV light emitting device, comprising:
   a substrate;
   a first super-lattice layer disposed on the substrate and comprising $Al_xGa_{(1-x)}N$; and
   a sacrificial layer disposed on the first super-lattice layer and comprising $Al_zGa_{(1-z)}N$ ($0<z\leq x<1$);
   wherein the sacrificial layer comprises an n-type impurity having a concentration of $3\times10^{18}/cm^3$ to $3\times10^{19}/cm^3$.

16. The template of claim 15, further comprising:
   a second super-lattice layer disposed between the first super-lattice layer and the sacrificial layer and comprising $Al_yGa_{(1-y)}N$ ($0\leq z\leq y\leq x<1$).

17. The template of claim 15, further comprising:
   an AlN buffer layer disposed between the substrate and the first super-lattice layer.

* * * * *